(12) United States Patent
Watanabe

(10) Patent No.: US 6,599,760 B2
(45) Date of Patent: Jul. 29, 2003

(54) EPITAXIAL SEMICONDUCTOR WAFER MANUFACTURING METHOD

(75) Inventor: Toru Watanabe, Saga (JP)

(73) Assignee: Sumitomo Mitsubishi Silicon Corporation, Tokyo (JP)

( * ) Notice: Subject to any disclaimer, the term of this patent is extended or adjusted under 35 U.S.C. 154(b) by 0 days.

(21) Appl. No.: 10/062,564

(22) Filed: Feb. 5, 2002

(65) Prior Publication Data

US 2002/0115294 A1 Aug. 22, 2002

(30) Foreign Application Priority Data

Feb. 6, 2001 (JP) ........................................ 2001-029650

(51) Int. Cl.⁷ .............................................. H01L 21/00
(52) U.S. Cl. ................. 438/5; 438/14; 438/7; 438/16; 438/460; 438/690
(58) Field of Search ............................ 438/5, 14, 7–9, 438/16, 460, 690; 29/156, 264

(56) References Cited

U.S. PATENT DOCUMENTS

| | | | | |
|---|---|---|---|---|
| 4,578,144 A | * | 3/1986 | Hiramoto | 117/45 |
| 4,756,796 A | * | 7/1988 | Saitou | 216/52 |
| 4,830,984 A | * | 5/1989 | Purdes | 438/492 |
| 5,863,659 A | * | 1/1999 | Kobayashi et al. | 257/627 |
| 5,970,365 A | * | 10/1999 | Takamizawa et al. | 438/459 |
| 6,057,170 A | * | 5/2000 | Witte | 438/14 |
| 6,066,565 A | * | 5/2000 | Kuroki et al. | 438/690 |
| 6,200,908 B1 | * | 3/2001 | Vandamme et al. | 216/59 |
| 6,352,927 B2 | * | 3/2002 | Kishimoto | 438/690 |
| 6,426,519 B1 | * | 7/2002 | Asai et al. | 257/103 |
| 6,433,352 B1 | * | 8/2002 | Oka | 250/559.3 |

FOREIGN PATENT DOCUMENTS

| | | | | | |
|---|---|---|---|---|---|
| JP | 55041752 A | * | 3/1980 | ......... | H01L/21/205 |
| JP | 02101737 A | * | 4/1990 | ......... | H01L/21/208 |
| JP | 03200323 A | * | 9/1991 | ......... | H01L/21/208 |
| JP | 04299822 A | * | 10/1992 | ......... | H01L/21/20 |

\* cited by examiner

Primary Examiner—George Fourson
Assistant Examiner—Michelle Estrada
(74) Attorney, Agent, or Firm—Morrison & Foerster LLP

(57) ABSTRACT

To minimize and stably suppress worsening of a warpage of a wafer in epitaxial treatment. A semiconductor wafer is flattened by a double-sided grinding machine. Machining strains produced at both sides of the semiconductor wafer are removed to measure a direction of the warpage of the semiconductor wafer. The direction of the warpage is adjusted and then, epitaxial treatment is performed.

5 Claims, No Drawings

EPITAXIAL SEMICONDUCTOR WAFER MANUFACTURING METHOD

BACKGROUND OF THE INVENTION

1. Field of the Invention

The present invention relates to an epitaxial semiconductor wafer manufacturing method, and particularly to an epitaxial semiconductor wafer manufacturing method of offsetting a warpage of a wafer produced due to epitaxial treatment by an original warpage of the wafer to reduce the warpage after the epitaxial treatment.

2. Description of the Prior Art

A semiconductor wafer made of silicon or the like used as a material of a semiconductor device is manufactured by passing through various steps such as a slicing step of cutting off a wafer from an ingot, a grinding step of flattening the wafer and a polishing step of mirror-finishing the surface of the wafer. By further applying epitaxial treatment to the surface of the semiconductor wafer thus manufactured, an epitaxial semiconductor wafer is manufactured.

One of the problems in manufacturing an epitaxial semiconductor wafer is the warpage of the wafer. That is, by applying epitaxial treatment to the surface of a wafer, a warpage of approx. tens of microns which becomes convex in a direction of the wafer surface with an epitaxial layer grown on it is produced because of a stress difference between a surface and a back of the wafer due to the epitaxial layer grown on the wafer surface.

To solve the above problem, Japanese Patent Laid-Open No. 6-112120 specification discloses a method of reducing the warpage of a wafer after epitaxial treatment by measuring the warpage before the epitaxial treatment is executed, adjusting the direction of the warpage to the direction opposite to the direction in which the wafer is warped and thereby offsetting the former warpage by the latter warpage produced due to the epitaxial treatment.

It is considered that the direction of the warpage of a wafer before epitaxial treatment is almost decided in a slicing step of slicing an ingot to a wafer and the initial warpage direction is kept even after passing through the grinding step and polishing step after the slicing step. Therefore, by designating the surface and back for slicing and executing subsequent steps, a warpage after epitaxial treatment is reduced.

A wafer cut out from an ingot by a wire saw has a large unevenness of approx. tens of microns. It is one of large objects of a grinding step to remove the unevenness from a wafer and flatten the wafer. To remove the unevenness, both-side simultaneous grinding is necessary. From this viewpoint, a double-sided lapping machine has been frequently used so far.

However, wafers have been recently increased in diameter and a double-sided lapping machine used for a large-diameter wafer has the following problems.
(1) Increase of costs of consumable materials and machine due to an increased size of the machine
(2) Increase of wafers in diameter and increase of operator in load due to increase of wafers in diameter
(3) Increase of industrial waste (waste polishing powder) due to increase of wafers in diameter Therefore, it is recently proposed to manufacture a wafer by a double-sided grinding machine instead of a double-sided lapping machine. The double-sided grinding machine simultaneously grinds the both sides of a wafer by symmetrically holding a part of the wafer from its both sides by a cup-shaped grindstone. Therefore, the double-sided grinding machine is not only capable of removing the unevenness of a wafer described above but also effective for solving the above problems (1) to (3) which are also problems of a large lapping machine.

However, it is clarified from the examination by the present inventor that when using a double-sided grinding machine instead of a double-sided lapping machine, the shape of the warpage of a wafer which is considered to be decided in a slicing step and left as it is greatly changed due to grinding of the wafer and the direction of the warpage is even inverted in an extreme case. Moreover, it is clarified that a warpage deformed due to the machining by a double-sided grinding machine is not stably kept to the end but the deformed warpage is comparatively easily returned to the true shape by removing the surface layer of the wafer and the stress remaining in the wafer.

Thus, an unstable warpage is created by performing machining by a double-sided grinding machine. Therefore, when measuring the direction of the warpage of a wafer before machining it by a double-sided grinding machine and measuring the direction of the warpage of the wafer immediately after machining the wafer, the measured warpage direction may be different from the actual warpage direction in epitaxial treatment and as a result, an epitaxial layer is formed on a face opposite to the face on which the warpage can be offset by epitaxial treatment, and the warpage produced by epitaxial treatment cannot be offset but the warpage may be accelerated.

SUMMARY OF THE INVENTION

It is an object of the present invention to provide an epitaxial semiconductor wafer manufacturing method capable of securely offsetting a warpage through epitaxial treatment even if performing effective grinding using a double-sided grinding machine.

The following is the reason why a new warpage is created through machining by a double-sided grinding machine. In the case of a double-sided lapping machine, the whole wafer is held by a surface plate having an area larger than that of a wafer and the entire surface of the wafer is simultaneously machined. The wafer currently machined is fixed in the thickness direction and a new warpage due to the thickness-directional movement of the wafer is not formed. In the case of a double-sided grinding machine, however, because a wafer is held in line contact by grindstones having an area smaller than that of the wafer, a force of constraint for fixing the wafer in its thickness direction while being machined only works on a part of the wafer held by the grindstones.

That is, because a wafer while being machined by a double-sided grinding machine is not sufficiently fixed in the thickness direction, the wafer may move in its thickness direction. Therefore, the movement of the wafer in its thickness direction forms a warpage after the wafer is machined.

An epitaxial semiconductor wafer manufacturing method of the present invention makes it possible to securely offset a warpage in epitaxial treatment by measuring the direction of the warpage of a semiconductor wafer, flattening the semiconductor wafer by a double-sided grinding machine when adjusting the direction of the warpage and performing epitaxial treatment, removing a machining-strain layer formed on the both sides of the semiconductor wafer due to the above flattening, and measuring the direction of the warpage of the wafer.

That is, by machining a wafer cut by a wire saw by a double-sided grinding machine, a strain layer formed on the surface of the wafer when it is cut and an unevenness component are removed and the flatness of the wafer is improved. However, a new warpage is formed due to the unbalance between residual strains of the surface and back of the wafer and the wafer is changed to a shape different from the warpage shape formed in the wafer cutting process. The direction of the warpage of the wafer measured under the above state is unstable. However, by removing the residual-strain layer formed due to the machining by the double-sided grinding machine, the warpage returns to the true shape and by measuring and adjusting the direction of the warpage under this state, directions of warpages of all wafers are adjusted to the direction for offsetting a warpage formed due to epitaxial treatment.

It is sufficient to execute a step of removing a machining-strain layer before performing epitaxial treatment after performing machining by a double-sided grinding machine. However, when executing the step after polishing for mirror-finishing, the mirror-finishing may be necessary again. Therefore, it is preferable to execute the step before polishing. Moreover, it is preferable to execute a step of measuring and adjusting the direction of a warpage before polishing in order to avoid attachment of particles. That is, it is the most rational process to remove a machining strain and adjust the direction of a warpage, and then perform mirror-polishing and epitaxial treatment. By performing etching before the mirror-polishing, it is possible to remove a new strain due to removal of a machining-strain layer and reduce a polishing amount in mirror-polishing.

Etching is considered as a method of removing a machining strain. When only etching is performed, however, the flatness (parallelism) is reduced due to the etching and a load increases due to the subsequent polishing. A preferable machining-strain removal method is a method of removing a surface machining-strain layer by an inverting single-sided grinding machine and thereby, the flatness (parallelism) of a wafer can be maintained. That is, because the inverting single-sided grinding machine grinds one side of a wafer while attracting and fixing the other side of the wafer to a surface plate, it is possible to fix the wafer in its thickness direction and remove a machining-strain layer without causing a warpage due to the difference between stresses of the surface and back of the wafer. However, because of the single-sided grinding machine, it is difficult to remove an unevenness produced due to cutting. Moreover, using alkali cleaning or slight etching together for inverting single-sided grinding is preferable because it is possible to reduce a polishing amount in the next step.

By measuring the true warpage direction of a semiconductor wafer and adjusting the direction and then executing marking, it is possible to put a mark on the same face to the warpage direction and determine the direction of the warpage in accordance with the mark.

DETAILED DESCRIPTION OF THE PREFERRED EMBODIMENTS

An embodiment of the present invention will be described below.

In the case of the epitaxial semiconductor wafer manufacturing method of this embodiment, a wafer is cut off from a cylindrical ingot made of single-crystal silicon or the like. The cut-off wafer has a total thickness variation (hereafter referred to as TTV) and an unevenness.

The surface and back of the above wafer are simultaneously ground by a double-sided grinding machine in order to improve the TTV and remove the unevenness.

As the machining condition in this case, it is proper to use a grindstone having a roughness of #320 to #10,000. At the time of increasing the roughness of the grindstone, the grinding time for each wafer increases and abrasion of the grindstone increases remarkably because the grinding capacity of the grindstone deteriorates though it is possible to reduce the surface roughness and the thickness of a machining-strain layer. However, when decreasing the roughness of the grindstone, the surface roughness and the thickness of the machining-strain layer increase and the load of an inverting single-sided grinding machine to be used in the next step increases though the grinding efficiency is improved.

A machining amount by a double-sided grinding machine requires a amount of (wafer TTV amount+surface roughness×2) or more. By securing the necessary machining amount by a grindstone, a surface macrounevenness is removed and a wafer having a TTV of approx. 1 $\mu$m is obtained. However, a machining-strain layer of several microns is left for each side. It is described above that the layer causes a new warpage.

By chamfering the outer periphery of a wafer and cleaning the wafer and then, grinding the surface and the back of the wafer in order by an inverting single-sided grinding machine, a machining-strain layer formed due to the machining by a double-sided grinding machine is removed. The above cleaning is performed to remove particles from the surface of the wafer causing dimples due to the machining by an inverting single-sided-grinding surface plate. It is more preferable to use an alkaline cleaning solvent having a high particle-removing property as the above cleaning.

It is sufficient that at least a grinding amount capable of removing a strain layer formed due to the machining by a double-sided grinding machine can be secured as a machining condition by an inverting single-sided-grinding surface plate. However, when considering the variation of thickness of a wafer before machined by an inverting single-sided-grinding surface plate and the control capacity of a grinding machine, a grinding amount of 10 $\mu$m or more for each side is necessary. A grindstone uses a resin-bond grindstone having a roughness of #2,000 or more. By grinding the wafer with a #2,000 resin-bond grindstone, it is possible to obtain a grind surface having a surface roughness of 0.1 $\mu$m or less and a machining-strain layer having a thickness of 1 $\mu$m or less.

Contamination is removed from the surface of the wafer through cleaning and then, the direction of the warpage of the wafer is measured by a measuring instrument and adjusted in accordance with the measured data to set the wafer in a carrier.

The wafer whose warpage direction is adjusted is marked by a laser marker. Specifically, a predetermined mark is provided for the wafer surface (concave-side face) on which an epitaxial layer will be grown in accordance with the laser mark standard. Moreover, a predetermined mark is provided for the wafer back (convex-side face) on which no epitaxial layer is grown. Because the direction of the warpage of the wafer is adjusted for marking, the same type of mark is provided for the face in the same direction as the direction of the warpage.

The chamfered portion is mirror-polished and then, the both sides of the wafer are simultaneously polished up to a mirror state by a double-sided grinding machine. It is also allowed to polish the chamfered portion by a polishing tape obtained by fixing fine abrasive grains to a film before polishing the portion by the grinding machine.

A polishing margin for both-side polishing requires only a polishing amount to be mirror-finished by removing a machining-strain layer formed due to single-sided polishing because a machining strain produced due to the machining by a double-sided grinding machine is removed by an inverting single-sided grinding machine before both-side polishing and it is possible to normally obtain a mirror surface through polishing of 10 $\mu$m or more.

It is possible to remove strains of the both sides and the chamfered portion produced due to grinding by using an etchant after the machining by the double-sided grinding machine and thereafter polishing the chamfered portion by the polishing tape, and reducing the strain layer remaining on the chamfered portion up to 1 $\mu$m or less. The etchant uses a solution of potassium hydroxide or sodium hydroxide or mixed acid of hydrofluoric acid and nitrous acid. An etching amount requires only a amount capable of removing a strain layer formed due to grinding. At the time of performing etching by at least 2 $\mu$m, it is possible to remove strains of the both sides and the chamfered portion.

The chamfered portion is mirror-finished and then, the both sides of the wafer are simultaneously polished into a mirror state. However, before the both-side polishing, a strain caused due to the machining by the inverting single-sided grinding machine is removed through alkali etching. Therefore, a machining amount by both-side polishing requires only a polishing amount capable of mirror-finishing the surface of the wafer and it is possible to normally obtain a mirror surface through polishing of 5 $\mu$m or more.

The wafer whose both sides and chamfered portion are mirror-finished is cleaned to remove particles and surface heavy metals and then, an epitaxial layer is grown on the surface of the wafer. Because directions of warpages of all wafers in an epitaxial step are adjusted in the direction for offsetting a warpage due to epitaxial treatment, the warpage due to the epitaxial treatment is offset by the true warpage of the wafer. As a result, a laser marked epitaxial wafer whose warpage is suppressed to a low degree is manufactured.

Moreover, by omitting marking, a non laser marked epitaxial wafer whose warpage is suppressed to a low degree is manufactured.

For the above embodiment, a case is described in which an epitaxial layer is grown on the surface of a semiconductor wafer. Moreover, a wafer manufacturing technology of the present invention can be applied to a film other than an epitaxial layer that causes a warpage on a semiconductor wafer when grown on the surface.

As described above, an epitaxial semiconductor wafer manufacturing method of the present invention makes it possible to stably minimize worsening-of a warpage by removing a residual strain due to the machining by a double-sided grinding machine and then measuring and adjusting the direction of the warpage. Therefore, it is possible to improve the manufacturing yield and quality of epitaxial wafers.

What is claimed is:

1. An epitaxial semiconductor wafer manufacturing method of measuring a direction of a warpage of a semiconductor wafer, adjusting the warpage direction, and executing epitaxial treatment, comprising:

flattening said semiconductor wafer by a double-sided grinding machine;

removing a machining-strain layer formed on both faces of the semiconductor wafer due to the flattening; and measuring the direction of the warpage of the semiconductor wafer, after removing the machining-strain.

2. The epitaxial semiconductor wafer manufacturing method according to claim 1, wherein the machining-strain layer is removed by an inverting single-sided grinding machine.

3. The epitaxial semiconductor semiconductor wafer manufacturing method according to claim 1, wherein the direction of the warpage of the semiconductor wafer is measured, then adjusted, and marked.

4. The epitaxial semiconductor wafer manufacturing method according to claim 1, wherein a machining-strain layer is removed, the direction of the warpage is adjusted, mirror polishing is performed, and epitaxial treatment is executed.

5. The epitaxial semiconductor wafer manufacturing method according to claim 4, wherein etching is performed before said mirror polishing.

* * * * *